US008940140B2

(12) United States Patent
Walters et al.

(10) Patent No.: US 8,940,140 B2
(45) Date of Patent: Jan. 27, 2015

(54) THIN FILM APPLICATION DEVICE AND METHOD FOR COATING SMALL APERTURE VACUUM VESSELS

(75) Inventors: Dean R. Walters, Naperville, IL (US); Grantley O. Este, Renfrew (CA)

(73) Assignee: Uchicago Argonne, LLC, Chicago, IL (US)

( * ) Notice: Subject to any disclaimer, the term of this patent is extended or adjusted under 35 U.S.C. 154(b) by 1697 days.

(21) Appl. No.: 11/850,409

(22) Filed: Sep. 5, 2007

(65) Prior Publication Data

US 2009/0057134 A1    Mar. 5, 2009

(51) Int. Cl.
| | |
|---|---|
| *C25B 9/00* | (2006.01) |
| *C25B 11/00* | (2006.01) |
| *C25B 13/00* | (2006.01) |
| *C23C 14/00* | (2006.01) |
| *C23C 16/00* | (2006.01) |
| *B05D 5/12* | (2006.01) |
| *C23C 14/04* | (2006.01) |
| *C23C 14/06* | (2006.01) |
| *C23C 14/08* | (2006.01) |
| *C23C 14/16* | (2006.01) |
| *C23C 14/34* | (2006.01) |

(52) U.S. Cl.
CPC .......... *C23C 14/046* (2013.01); *C23C 14/0036* (2013.01); *C23C 14/0641* (2013.01); *C23C 14/081* (2013.01); *C23C 14/16* (2013.01); *C23C 14/345* (2013.01)
USPC ............ 204/298.21; 204/298.02; 204/298.08; 204/298.12; 204/298.14; 118/723 E; 427/476

(58) Field of Classification Search
CPC  C23C 14/0036; C23C 14/046; C23C 14/081; C23C 14/0641; C23C 14/16; C23C 14/345; H01J 2893/0004; H01J 2893/0002; H01J 2893/0048; H01J 2893/0054; H01J 9/225; B05B 5/12; B05B 5/08; B05B 15/0412; B05B 5/032
USPC ................ 204/192.1, 192.12, 192.3, 298.22, 204/298.21, 298.02, 298.12, 298.14; 427/476; 118/723 E
See application file for complete search history.

(56) References Cited

U.S. PATENT DOCUMENTS

| | | | | |
|---|---|---|---|---|
| 4,132,613 A | * | 1/1979 | Penfold et al. | 204/192.12 |
| 4,374,722 A | * | 2/1983 | Zega | 204/298.03 |
| 4,376,025 A | * | 3/1983 | Zega | 204/192.12 |
| 5,298,137 A | * | 3/1994 | Marshall, III | 204/192.12 |
| 5,744,017 A | * | 4/1998 | Tamagaki et al. | 204/298.41 |
| 5,814,195 A | * | 9/1998 | Lehan et al. | 204/192.12 |
| 6,436,252 B1 | * | 8/2002 | Tzatzov et al. | 204/298.22 |
| 6,767,436 B2 | * | 7/2004 | Wei | 204/192.3 |
| 2006/0207871 A1 | * | 9/2006 | Yumshtyk et al. | 204/192.1 |

FOREIGN PATENT DOCUMENTS

EP          43789 A  *  1/1982

* cited by examiner

*Primary Examiner* — Michael Band
(74) *Attorney, Agent, or Firm* — Cherskov, Flaynik & Gurda LLC

(57) ABSTRACT

A device and method for coating an inside surface of a vessel is provided. In one embodiment, a coating device comprises a power supply and a diode in electrical communication with the power supply, wherein electrodes comprising the diode reside completely within the vessel. The method comprises reversibly sealing electrodes in a vessel, sputtering elemental metal or metal compound on the surface while maintaining the surface in a controlled atmosphere.

17 Claims, 4 Drawing Sheets

THIN FILM APPLICATION DEVICE AND METHOD FOR COATING SMALL APERTURE VACUUM VESSELS

CONTRACTUAL ORIGIN OF INVENTION

The United States Government has rights in this invention pursuant to Contract No. 82644-23-131, YN-19-01 between the U.S. Department of Energy and the University of Chicago, representing Argonne National Laboratory.

BACKGROUND OF THE INVENTION

1. Field of the Invention

The invention relates to a device and method for preparation of vessels by cleaning and coating the interior walls of the vessels, and more specifically, the invention relates to a device and method to provide a continuous and uniform film to interior nonplanar walls of small-diameter elongated vessels.

2. Background of the Invention

Scientific instruments commonly require preparation in order to be optimally operable. For instance, a coating may need to be applied to prevent a chemical reaction between the reagents and the chamber walls. Alternatively, a coating may be deemed necessary to give a chamber required physical properties.

Reaction chambers continue to develop in sophistication, particularly as microscale processes are utilized, and advanced forms of reactants are required.

Seamless, electrically continuous films are also necessary to optimize macro-scale processes. For example, energy efficiency is a crucial parameter for operating a linear accelerator economically and an acceleration scheme operating at high efficiency is required. Inherent inefficiencies are built into certain linear accelerator paradigms, however, such as when wake fields develop during the interaction of the electron beam and the enclosing walls. The wake fields are electromagnetic fields produced by the interaction of a beam of relativistic charged particles with nearby conducting surfaces, such as walls of a vacuum chamber. These fields remain in the 'wake' of the leading particles and provide driving forces that act on trailing particles, potentially causing longitudinal and transverse beam instabilities. The wake acts on the trailing particles, potentially causing beam instabilities.

As light sources, such as the Advanced Photon Source (APS) in Argonne Laboratory in Argonne, Ill., increase their output, higher currents are required, which in turn calls for protection of the electron and light conduits utilized. Continuous films must be applied to the inner surfaces of these conduits so as to allow accelerator physicists the means to modify construction materials parameters, leading to increases in the performance envelope of the light source. "Continuous" films comprise surfaces that are directly exposed to the electron beam and that electrically connect to each other.

Given the importance of the physical properties of the chamber in which reactions take place, several means are well-known for creating an inner vessel of a particular inner coating. One method of achieving a specific inner coating is to instill that coating at the time the vessel is manufactured. Methods for manufacture of a vessel with an integrated inner coating are described in patents such as U.S. Pat. No. 4,091,138. However, the '138 patent and other similar methods have a number of drawbacks. First, when a material is integrally coated at the time of the manufacture, the purpose of the material must not significantly change over the course of its useful life. Inasmuch as the vessel is integrally molded or cast with the coating material, it cannot be used for another purpose that would require a different inner coating. Further, a process that instills a coating at the time of the manufacturing cannot be used at a later time when the same coating has to be reapplied.

An approach for achieving a coating on a vessel or work piece is also disclosed by U.S. Pat. No. 4,790,262. That invention uses a centrifugal force to deposit a coating by spinning the piece to be coated whilst applying a liquid coating solution to the piece. The '262 invention requires the coating material to be in a liquid state.

Sputtering is a process used to deposit a film onto a substrate whilst in a vacuum. A high voltage is passed across low pressure gas to create a plasma of electrons and ions in a high energy state. The ions hit a target of the desired coating material and cause atoms from that material to be ejected and bond with the substrate.

Several patents, such as U.S. Pat. No. 4,166,018 describe various improvements related to producing a coating of varying thickness. These devices have significant shortcomings, however. Several sputtering devices only work to coat flat surfaces. As a result, devices such as the '018 patent are hard pressed to sputter a coating on a surface that already has been turned into a closed vessel such as a round tube.

While some coated planar substrates can be curved after the coating process occurs, radii of such curvatures are limited to prevent de-lamination, weak surface adhesion, and general deformation of the coatings. As a high level of adhesion is an objective of most coating processes, and inasmuch as the rate of adhesion is directly related to energy of particles upon contact with the wall, sputtering is the preferred method as it results in particles imbued with high energy. Other coating methods, such as evaporation, do not result in high-energy particles.

Further, while the prior art discusses improvements to sputtering methods, none of the prior art references discuss a coating method which can be used with a small access aperture. Prior art coating methods based on sputtering employ strong magnetic fields and the generation of the field within the item to be coated requires a large access envelope.

Various sputtering methodologies exist. In one sputtering configuration, an ion beam is generated using a point source ion gun. Such an approach cannot be used to coat long chambers, something the present invention accomplishes through its use of a dual gas-vacuum exit scheme.

Another coating method employs Chemical Vapor Deposition (CVD). CVD-based methodologies require heating elements to be placed into the vessel to be coated. As such, they require additional space both at the insertion point and within the vessel itself. Further, CVD coating methods generate non-uniform film when used in conjunction with enclosed vessels. Also, and as noted above, such vapor deposition processes do not provide the high energy impact necessary to assure tight adhesion of coating particles and moieties to target surfaces, thereby resulting in tightly adhering, electrically continuous and blemish free films overlaying the substrates.

A need exists in the art for a device and method for facilitating the deposition of coatings on surfaces defining cavities less than 15 mm in diameter. Prior art devices are limited to applications involving tubing of a minimum diameter of 0.75 inches (19 mm) and these prior art devices cannot deposit a consistent film on a long tube. The device and method should not be limited to coating flat planes, but rather enable the coating of the entire inside of a vessel. The invention should also allow for an inner coating to be reapplied at any time, not merely at initial manufacture of the coated substrate.

SUMMARY OF THE INVENTION

An object of the invention is to provide a device and method useful in cleaning, coating and applying an electrically continuous film onto the inner surfaces of vessels which overcomes many of the disadvantages of the prior art.

Another object of the present invention is to provide a device and method to enable deposition of film on curved (non-planar or non-flat) surfaces of vessel interiors. A feature of the invention is utilizing a diode paradigm whereby the diode's electrodes reside substantially within the vessel. An advantage of the invention is that vessels with unlimited length can be coated. The sole requirements are that the electrode be substantially centered and that the resistance of the cathode be low.

Still another object of the present invention is to provide a device and method for coating vessels having inner diameters as small as 5 mm. A feature of the invention is that the electrode or electrodes are removably positioned substantially within a hermetically sealed vessel. An advantage of the invention is that it provides a means for coating substantially the entire interior of a vessel, including planar and nonplanar surfaces of the vessel, in a continuous, blemish-free film of between 20 nm and 1,000 nm which is devoid of pores, uneven thicknesses, and other flaws, thereby physically and electrically isolating the underlying vessel surface from fluids passing through the vessel. The preferred thickness of the resulting film coating ranges from 50 nm to 420 nm.

Yet another object of the present invention is to provide a method for applying film to curved surfaces of interior walls of a conduit, vessel, or reaction chamber. A feature of the invention is that it provides for the film, or another film comprised of different constituents, to be serially applied to the surfaces after the surfaces are initially covered. An advantage of the invention is that the vessel can be used to transport entirely different fluids during its entire life cycle.

A further object of the present invention is to provide a method of applying a thin film coating to a vessel while cleaning the vessel walls. A feature of the invention is an initial application of current to the vessel walls to cause the vessel walls to sputter off particles considered as impurities to a film desired to overlay the walls. An advantage of the invention is that this bias cleaning (i.e., planarization) is accomplished using a single diode. In coating mode, one embodiment of the invention uses two electrodes to facilitate the deposition of a film onto the inner walls of the vessel.

The invention provides a device for coating an inside surface of a vessel, the device comprising a power supply; a diode in electrical communication with the power supply, said diode comprising a cathode and an anode; means for controlling the atmosphere in which the surface of the vessel resides; and a gas that displaces the atmosphere while the cathode is positioned within the vessel.

Also provided is a method for coating an interior surface of a vessel, and a method for producing a coated vessel, the method comprising determining a first inner diameter of an aperture of a vessel; selecting a cathode having an outer diameter less than the first inner diameter of the vessel; passing the cathode through the aperture so that the cathode resides substantially within the vessel while simultaneously being electrically isolated from the vessel; filling the atmosphere of the interior of the vessel with a fluid; and establishing an electrical gradient between the cathode and the vessel such that neutral atoms, neutral clusters, or ions (such as negatively-charged moieties) emanate from the cathode and adhere to the interior surface of the vessel. In one embodiment, the fluid is a reactive gas selected from the group consisting of Nitrogen, Hydrogen, Oxygen, and combinations thereof and the moieties adhere to the interior surface as a compound.

In the case where negatively charged moieties are produced at the cathode, such moieties are accelerated toward the substrate, causing a resputtering at the substrate. Resputter rates of 20 percent or more are experienced when aluminum is sputtered in pure oxygen atmospheres (oxygen readily forms negative ions) to produce $Al_2O_3$ films. Resputtering is the material leaving the targeted substrate and reduces the quantity of material. In situations where there is resputtering, the resultant film is the summation of the deposited film from the source and the resputtered material from the substrate. Resputtering is not always a bad thing in that if it is controlled it can be used to alter the properties of the film favorability.

Specifically, one embodiment relates to a device for coating of a vessel. The device, as shown in FIG. 1, comprises at least a vessel with an aperture, a power supply, two elongated substrates such as tubes (one serving as an anode the other serving as a cathode), and a gas that fills the vessel to create a plasma once current is applied to either the anode or cathode. Moieties from the plasma impact moieties residing on the surfaces of the elongated substrates such that the later are ejected or otherwise removed from the surfaces of the elongated substrates to impact with and form a film over the walls of the vessel.

Another embodiment also relates to a device for coating of a vessel. The alternative device is shown in FIG. 2, and comprising at least a vessel with an aperture, a power supply, but only one tube (acting as an cathode), and a gas that fills said vessel to create a plasma. In this alternative embodiment, the walls of the vessel act as the anode.

Another embodiment relates to a method of depositing an inner coating on a vessel through the use of the device described herein.

DESCRIPTION OF THE DRAWING

Embodiments together with the above and other objects and advantages may best be understood from the following detailed description of the embodiments illustrated in the drawings, wherein.

DETAILED DESCRIPTION OF THE INVENTION

The present invention is designed to apply a thin film of thickness ranging from 50 nm to 420 nm onto the walls of vacuum vessels with apertures too small to allow prior art devices to be used. The film is applied using a sputter deposition process. The present invention does not suffer from certain shortcomings of the prior art as it allows for an inner coating to be reapplied at any time, not merely at manufacture of the substrate to be initially covered.

Suitable vessel candidates to be coated with the instant process and device include, but are not limited to undulator chambers, free electron laser tubes, interior surfaces of conduits used in a high corrosion environment (such as in chemical, nuclear, or semi-conductor environments), and conduits made from chemically intolerant metals and alloys for use in corrosive environments. The invention further enables the deposition of dielectric films, including aluminum oxides, titanium oxides, nitrides, carbides, and combinations thereof.

In the several embodiments presently described, the invented device and method facilitate deposition of a layer, or a plurality of layers, of aluminum on to chamber walls; however, alternative coatings are contemplated and not foreclosed by this design. For instance, it is possible to accomplish coatings of multiple materials. One method for accomplishing this is to include different gasses at different stages of the process. If during the course of the sputtering, Argon gas is replaced by Oxygen, the resulting coating would have a layer of Aluminum followed by Aluminum Oxide. An additional approach is to use diode tubing of various materials. For instance, to achieve an inner film layer of gold, an aluminum rod coated with gold could be employed.

The present invention takes a different approach from prior art coating devices. Rather than relying on physical movement of a liquid coating, the present invention uses an atomic sputtering method to deposit the source material onto the surfaces intended to be coated. One embodiment of the present invention uses a solid metal rod as the source of the coating material. The solid metal rod should be placed approximately in the center of the vessel to be coated.

Device Detail

A diode sputtering apparatus using an Alternating Current power supply with dual cathodes is provided. Unlike prior art devices, the present apparatus uses AC power. The use of AC power allows for a lower voltage to be used. Further, the AC power does not cause arcs to form between the charged diode and the walls of vessel to be coated. These arcs are the bane of prior art devices as they damage the vessel walls even while attempting to improve the vessel by coating its walls.

Figure 1:
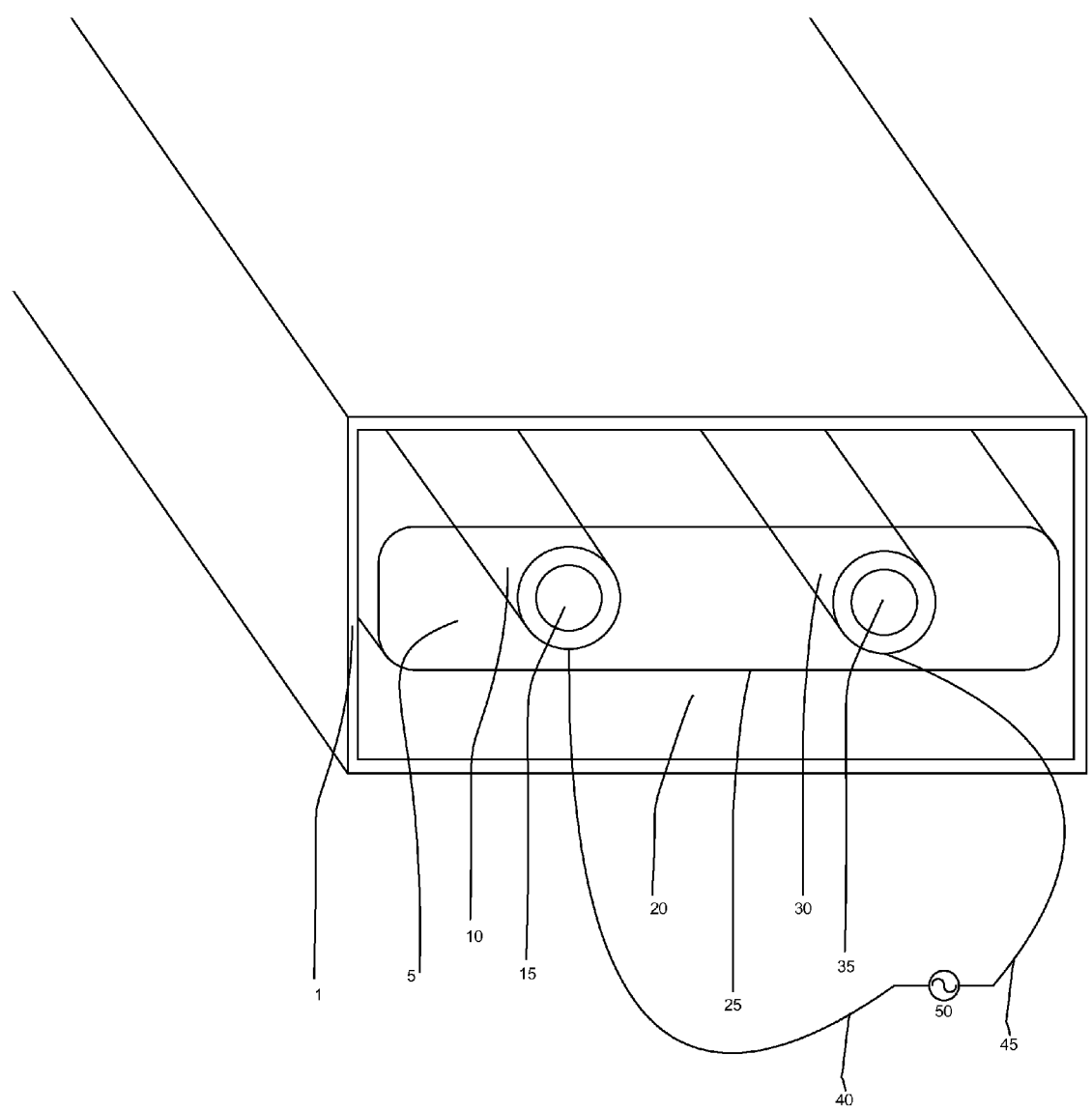
FIG. 1 depicts a sectional view of the coating device as installed and operating to coat a vessel in one embodiment.

FIG. 1 presents one embodiment of the invention. As depicted in FIG. 1, the vessel to be coated 1 is emptied of its contents and placed in an assembly capable of maintaining a vacuum. The vessel 1 defines an interior surface made from an electrically conductive material such as metal, alloy, or composite material which contains electrically conductive material dispersed through nonconductive material or dielectric material.

Alternative materials for vessel surfaces to be coated are non-electrically conducting in nature, and include, but are not limited to, glass and ceramic. In instances where non-conductive vessels are coated, the sputtered material settles on the wall due to the kinetic energy generated when the material is sputtered off from the diode.

As discussed in conjunction with FIG. 2 below, when a conductive vessel is used, it can be charged and the sputtered material is additionally attracted to the vessel walls. Specifically, applying a negative potential to the vessel chamber with respect to the cathodes and anodes will result in a resputtering process whereby after the electrode is sputtered, the vessel surfaces are sputtered. This feature of ion bombardment of growing films has several advantages, a main advantage being that adhesion of the films is enhanced.

Further elements of one embodiment include two aluminum rods 10 and 30 which are positioned inside the vessel 1 so as to extend in a direction parallel to the longitudinal axis of the vessel. One rod functions as the cathode 10 the other rod functions as the anode 30. The rods 10 and 30 are connected via conductors 40 and 45 to a power source providing alternating current 50. The rods 10 and 30 define axially extending (relative to the longitudinal axis of the vessel), interior channels 15 and 35. A coolant solution is passed through the channels 15 and 35 during the coating process. The channels 15 and 35 run substantially coaxially with the longitudinal axis of the cathode 10 and anode 30. In one embodiment, the coolant solution is de-ionized water with a temperature between 15 and 50 degrees Celsius. In another embodiment, the cathode 10 and anode 30 are comprised of aluminum. Alternative embodiments use rods 10 and 30 made from chromium and titanium.

In order to begin the sputtering coating process, a vacuum is pulled on the vessel 1. In one embodiment the vacuum pressure is suitable when any remaining oxidizing moieties are not a significant factor in the ensuing plasma formulation process. An exemplary pressure is 0.02 torr. The vessel 1 is then filled with a gas 20.

Coating Detail

The fluid is a reactive gas selected from the group consisting of Nitrogen, Hydrogen, Oxygen, and combinations thereof and the ions adhere to the interior surface as a compound. While multiple gases are considered, the gas selected to fill the vessel 1 would be chosen so as to achieve a particular inner coating. If a non-reactive gas 20 is chosen, such as the noble gas Argon, then the resulting coating on the vessel 1 would derive from metal comprising the rods 10 and 30 such that the coating is a neat representation of the metal. Generally then, when the fluid is an inert gas selected from the group consisting of argon, neon, krypton, and zenon, and combinations thereof, the ions which adhere to the interior surface are elemental metal. Inasmuch as the inert or shield gas needs to be easily ionized gases heavier than helium make better choices. However, lighter gasses, such as Helium can be used but use of such a lighter gas entails use of higher voltage to ignite the plasma.

Igniting the plasma is a first step in changing the mass of the inert gas atoms intended for impact against target surfaces. Igniting the plasma ionizes the shield gas (in this test set up, Argon is the shield gas) so that it responds to the electric and magnetic fields.

The mass ratio of the shield gas to the sputtered material has a direct effect on particle momentum. The energy of the particles will be some distribution below the plasma operating potential. This potential can be changed by changing the pressure in the chamber.

Sputtering efficiency is maximized in the invented process when the atomic mass of the sputter gas (also referred to as shield gas) and the atomic mass of the sputtered material is the same or at least within a few integers of each other. This parity occurs when the shield gas is heavy (i.e., heavier than helium or argon), such gases including xenon and krypton. The cross section of heavy gases, i.e, heavier than helium or argon, such as krypton and xenon is larger than the lighter shield gas choices, and they require more voltage to ionize. An even greater factor to maximizing sputtering efficiency is the ease of which the gas can be ionized. However, the ratio of the sputter-gas atomic mass to the sputter-material atomic mass can be manipulated to achieve different results. When the sputter gas has less atomic mass than that of the sputtered material, there will be an abundance of reflected neutrals off the electrode and elsewhere within the chamber, resulting in substantial bombardment of the growing film on the target surface. However, after the establishment of a few monolayers of film, continued energetic bombardment of growing films results in stress modification of the resulting film. When the sputter gas is heavier than the sputtered material, (i.e., the energy of the bombardment against the surface is less) relatively few reflected neutrals are generated, resulting in the production of more tensile films.

Thus, the invention provides a means for tailoring sputter rates to produce films which are high adhering, or high tensile, or which contain localized stress characteristics.

Alternative embodiments use a reactive gas 20 to fill the vessel 1. Use of a reactive gas results in a formation of compound film coatings on the interior walls of the vessel 1. For instance if the selected gas 20 is Nitrogen, either neat or as a component of a composite gas, and the rods are Aluminum, the resultant coating would be Aluminium nitride (AlN). If Oxygen is used as the process gas (i.e., the displacement gas) 20, either neat or as a component of a composite gas, and the rods 10 and 30 are aluminum, the resulting coating is Aluminum oxide ($Al_2O_3$).

Suitable other metal-coating constituents are summarized in the table below. However, these candidates are exemplary only. Generally, any metal which confers sought-after coating characteristics for the particular project or application are appropriate, as long as the metals are reactive to the reactive gas utilized.

| Rod 10 and 30 Material | Reactive Gas 20 | Resulting Coating |
| --- | --- | --- |
| Chromium | Nitrogen | Chromium nitride (CrN) |
| Titanium | Nitrogen | Titanium nitride (TiN) |
| Titanium | Oxygen | Titanium dioxide (TiO2) |

Once the vessel 1 is filled with displacement gas 20, a voltage is established between one rod (i.e. electrode) 10, connected to one side of the alternating current power supply 50 and the other rod (a second electrode) 30, which is connected to the opposing side of the power supply 50. Once current is applied to the rods, a plasma 5 forms. Over the course of the coating process, a first electrode 10 sputters moieties against the vessel's target surfaces while a second electrode 30 dissipates any charge built up. Then, the first electrode 10 dissipates charge and heat while the second electrode 30 sputters moieties against the target surfaces of the vessel. This alternating sputtering sequence occurs at a frequency of 50 kHz, given a standard AC feed.

During the sputtering procedure, a boundary 25 forms between the plasma and the displacement gas 20. The boundary 25, while depicted with a set line in FIG. 1, would be of an indeterminable shape at any one given time interval. During the course of the process, the entirety of the displacement gas 20 would be involved in the sputtering reaction and would become plasma gas 5.

During the course of the sputtering, the electrodes 10, 30 must be fixed so as to prevent direct contact between the two tubes and between the tubes and the vessel 1. In one embodiment, the electrodes 10, 30 have an outer diameter of about 1.5 mm and an inner diameter of about 0.8 mm. Further, the electrodes 10, 30 feature channels 15, 35 adapted to receive a coolant solution during the coating process.

Additionally, in one embodiment, during the coating process, the vessel 1 is maintained in a vertical position. The position of the vessel 1 is maintained so as to prevent contact between the electrodes and the vessel 1 walls, which would damage the vessel. Vertical electrode arrangements eliminate the effect of gravity on the position of the cathodes and anodes in the vessel. As such, vertical electrode arrangements maximize film deposition processes in instances where the reaction chamber (i.e., the interior of the vessel being coated) defines very high aspect ratios.

In either horizontal or vertical or slanted configuration, the electrodes are positioned in close spatial relationship to each other and to the vessel surfaces while a physical gap is maintained between the electrodes, and between the electrodes and the surface to be coated. In the described embodiment, the power supply 50 generates 60 kHz AC current and has a rating of 1,000 W. The current application alternates between the first electrode and second electrode at regular intervals so as to allow one tube to sputter material while the other undergoes cooling. Suitable frequencies are those from 10 kHz to 100 kHz. In one embodiment the changes occur at a frequency of 50 kilohertz. Generally, higher frequency currents, (i.e, higher than 50-60 kHz) are utilized to minimize arc duration if arcing does occur. Generally, as frequency rates go up, deposition rates decrease.

As described in FIG. 1, the coating device can be used to coat vessels 1 subject to a vacuum seal.

Figure 2:
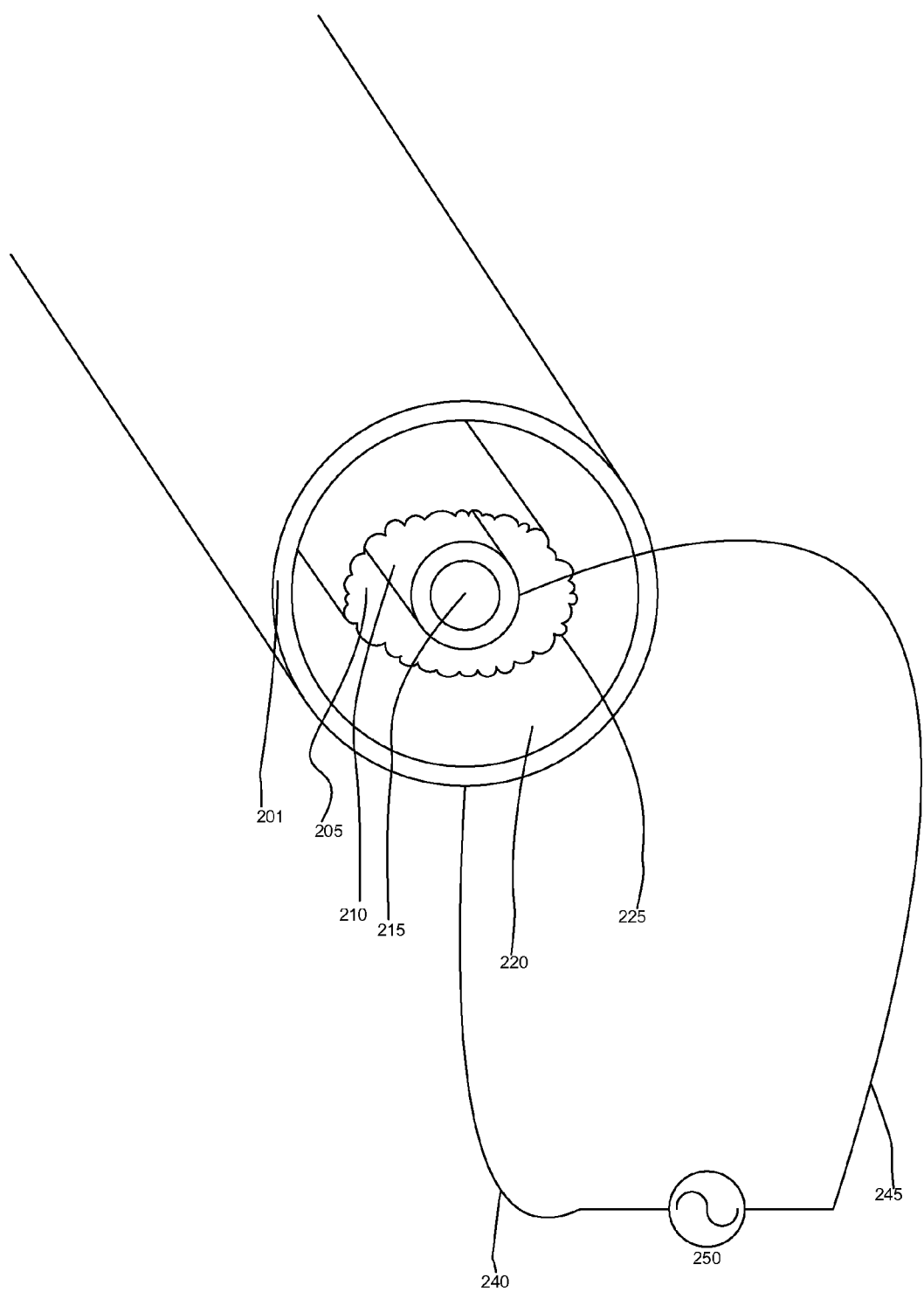
FIG. 2 depicts a sectional view of the coating device as installed and operating to coat a vessel in an alternative embodiment.

FIG. 2 depicts an embodiment of the invention in which only one electrode 210 is utilized. Such a configuration alternates power from the power supply 250 to the tube 210 and vessel hull 201. This allows the device to fit into vessels 201 featuring small apertures that would not otherwise accommodate two electrodes. The ratio of the diameter of the vessel to the diameter of the electrode is selected to be high to optimize deposition on the chamber walls, while at the same time providing a distance between the electrodes to confer electrical isolation/insulation from each other. In one embodiment, a suitable configuration is where the outer diameter of the cathode is one-third the inner diameter of the vessel. Exemplary vessel to electrode diameters include, but are not limited to 4.2:1 to 23:1. Specific ratios include 4.2:1, 7.3:1, 12.5:1, and 23:1. A large amount of bombardment of the growing film occurs in this paradigm. The electrode 210 is connected to the power supply 250 via a means for establishing electrical communication (such means including conductive wire) 245. The vessel 201 is likewise connected to the power supply 250 with another wire 240. The electrode 210 defines an internal channel 215. During the coating process, the interior channel 215 contacts a coolant solution such as water.

Analogous to the dual electrode configuration of FIG. 1, in order to begin the coating process, the rod 210 is inserted in the vessel 201 the interior of which is substantially evacuated of appreciable amounts of reactive gas. Next, the displacement gas 220 is pumped in. The same alternative possible displacement gasses 220 as described in conjunction with FIG. 1 may be used with FIG. 2. Once a current is applied to the rod 210, a plasma 205 forms. Concomitantly, a boundary 225 between the plasma 205 and the displacement gas 220 forms. The sputtering process then proceeds to deposit the electrode 210 material on the interior walls of the vessel 201.

A requirement of the alternative configuration disclosed in FIG. 2 is that the vessel 201 comprises an electrically conductive material. Further, the vessel 201 is isolated from its environment so that the power from the power supply 250 is not diverted towards the ground. In this single electrode configuration, the vessel serves as the anode, while the rod serves as the cathode of the diode. As shown in FIG. 2 an optional arrangement is where the rod (i.e. cathode) is positioned coaxial with the longitudinal axis of the conduit needing coating.

Generally, distances between cathodes and anodes range are variable, depending on operating frequency and diameters of the electrodes. Current state of the art relegates electrodes in the invented system to be no closer than 0.5 millimeters, but improvements in electrode fabrication can decrease this distance. Similarly, a manageable maximum distance of separation of electrodes is approximately 100 mm, but inasmuch as plasmas conduct over greater distances, this 100 mm figure is not meant to be restrictive, merely illustrative.

Figure 3:
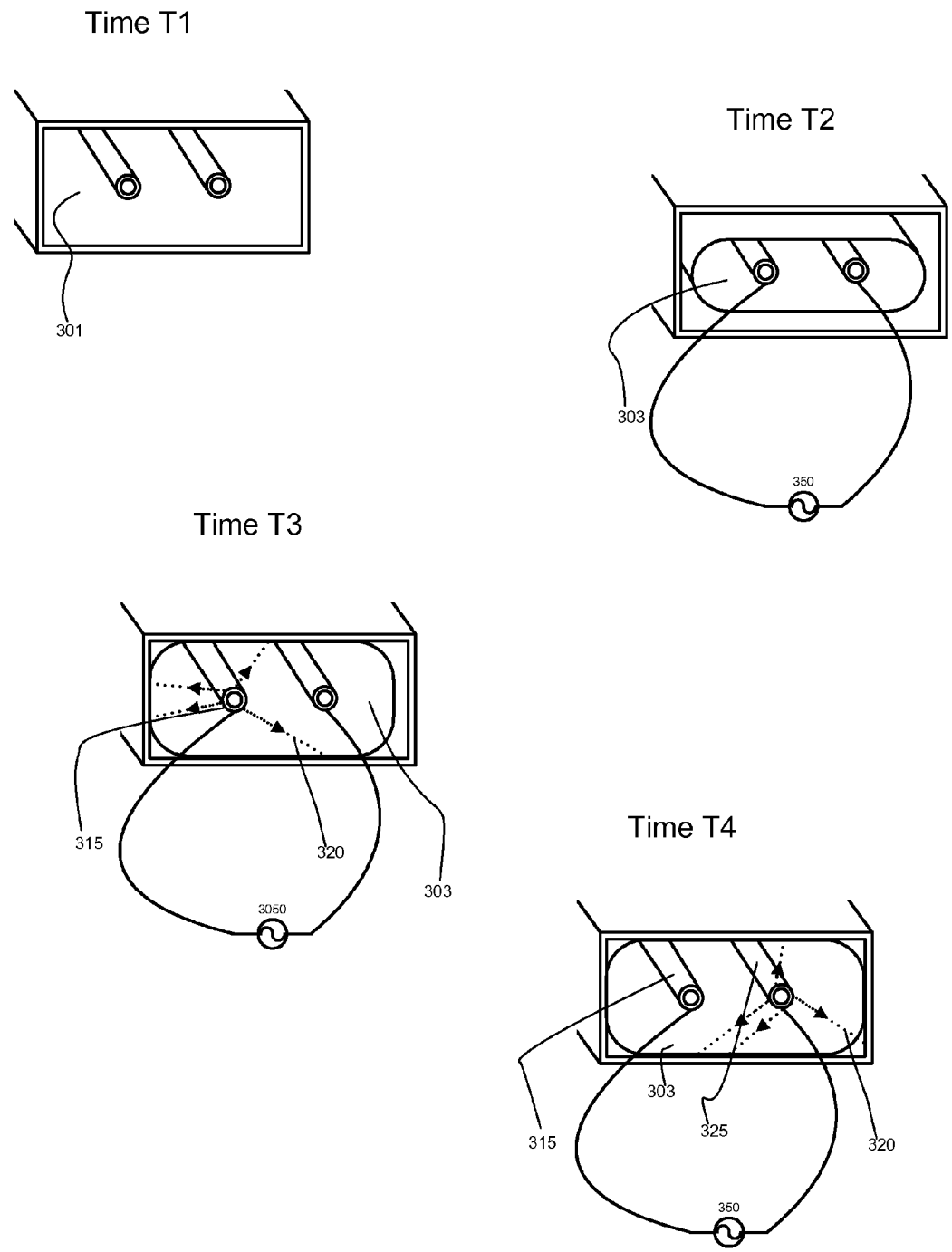
FIG. 3 is a schematic depiction of the coating process comprising two encapsulated electrodes, in accordance with features of the present invention.

The process described in either FIG. 1 or FIG. 2 could be adapted to coat a flat plane whereby an enclosed vessel is first coated; then the vessel is laid open to a flat configuration. Turning now to FIG. 3, therein shown is the vessel coating process at four time intervals T1 to T4.

Initially, at time interval T1, the gaseous contents 301 of the vessel are substantially removed so as not to be a factor in any subsequent plasma reactions. In one embodiment, at this time period T1, the vacuum pressure within the vessel 301 decreases to approximately 5 mTorr. Once the vacuum is achieved, the vessel 301 is filled to 1.2 Torr with Argon gas. Time interval T1 concludes with a period of running an argon gas purge within the vessel 301. In one embodiment time interval, T1 comprising the purge lasts 3 hours.

At time interval T2, current is applied via the power supply 350 and maintained at a predetermined level. In one embodiment, the power supply 350 provides 60 watts AC current. During this time interval T2, the argon gas is ionized into a glow discharge and forms a plasma 303.

Time interval T3 begins with increasing the power supply 350 output. In one embodiment, the output is increased to a level suitable to cause displacement of electrode moieties by argon moieties. A suitable current level is 800 watts. During this time interval T3, if the electrodes comprise aluminum, deposition of the aluminum to the target surfaces of the vessel interior commences.

In one embodiment of the invention, each cathode 315 is connected to one side of the power supply 350 and the chamber walls are grounded. The aluminum is sputtered off 320 the negative cathode 315 by the accelerating argon ions colliding into it and ejecting aluminum.

Time interval T4 is reached when the polarity of the cathode 315 changes. Then the second cathode 325 sputters aluminum 320. When the polarity switches to positive, the electrons of the first cathode 315 will be discharged thus preventing a damaging arc that can ruin the polished chamber.

Over the course of the coating process as depicted by FIG. 3, the state of the coating mechanism alternates between time intervals T3 and T4 as the sputtering rod 320 alternates. In one embodiment, the time intervals T3 and T4 change at a frequency of 50 kHz. This creates a distinct advantage in instances where aluminum electrodes are used. Aluminum oxide, a dielectric which characteristically overlays pure aluminum substrate, releases from the charged cathode during the negative portion of the cycle and adheres to the target surface. As the process progresses, the thin aluminum oxide coating on the cathode ultimately disappears from the surface of the cathode, the result being exposure of the pure aluminum underlayment of the cathode. As the cathode continues to be charged, the pure aluminum sputters from the cathode surface to the vessel walls. The result of this process is a vessel wall first coated with aluminum oxide, which in turn is overlaid by a film of pure aluminum. If that pure aluminum film is subsequently exposed to oxygen, a surface of that pure aluminum film will turn to aluminum oxide such that a final film will be comprised of three distinct layers, namely a pure aluminum layer positioned intermediate two aluminum oxide layers.

At either time periods T3 or T4, the aluminum 320 will travel from the cathode until it strikes a surface and adheres to it.

In one embodiment, this process is performed at a high pressure, approximately 0.7 torr. The distance that the sputtered aluminum 320 can reach is limited to ~30 mm due to the short mean-free path. Inasmuch as the invention is optimized to coat vessels with small apertures, there is no lack of coverage.

Figure 4:
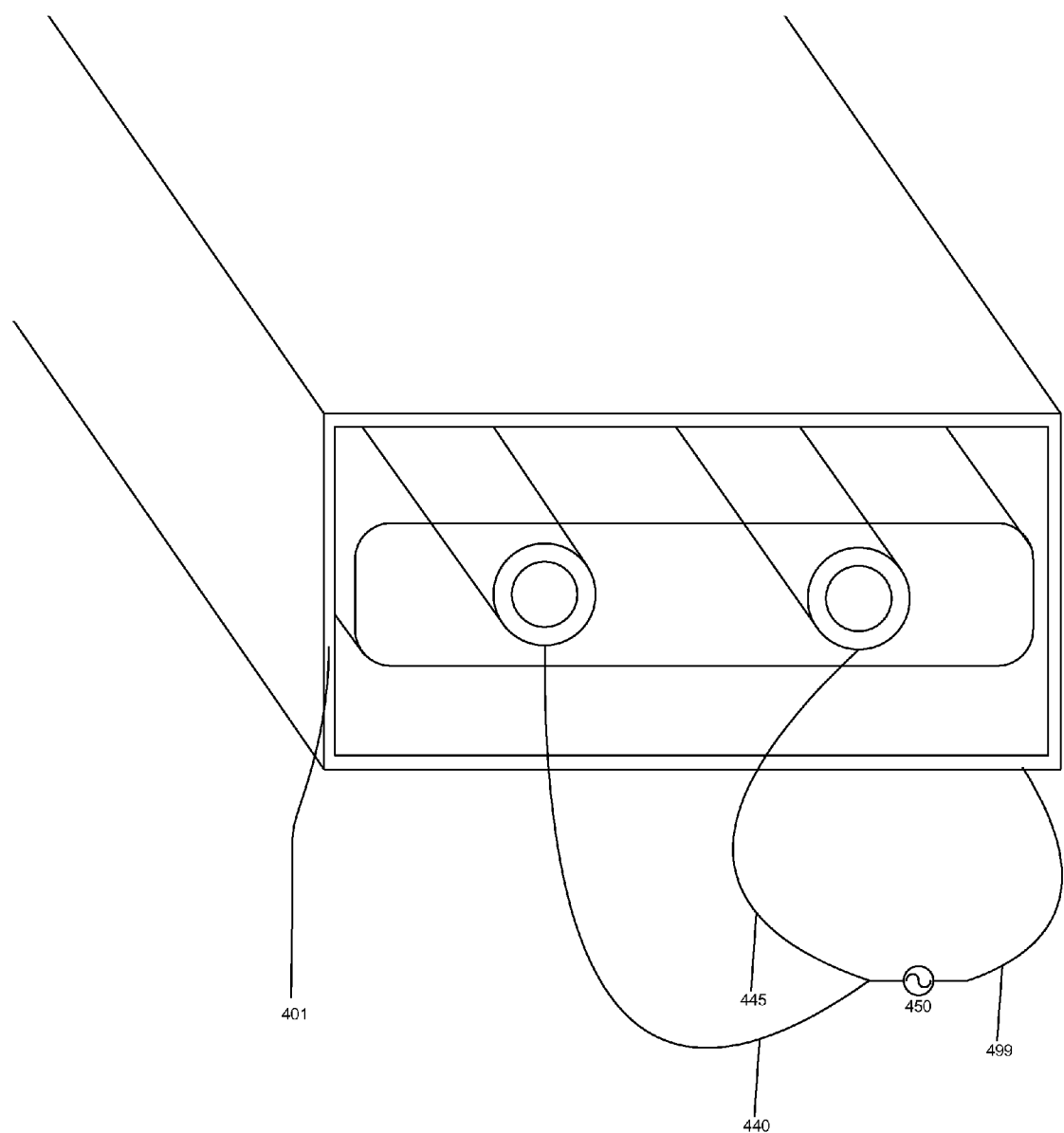
FIG. 4 is a schematic depiction of a two electrode coating device, in accordance with features of the present invention.

Turning finally to FIG. 4, which presents another embodiment of the invention, as depicted in FIG. 4, the vessel to be coated 401 is connected to the power supply 450 via a conductive connector 499. The dual rods are connected together 440 and 445 on one end of power supply 450. The power supply 450 alternates current between the two rods and the vessel 401. A feature of the embodiment of FIG. 4 is that the vessel 401 acts as a third electrode. The vessel 401 has an effect similar to an ion gun and would effectively "peen" the coating deeper into the vessel 401 interior walls when the cathodes are charged so as to sputter ions.

A feature of the embodiment of FIG. 4 is that the glow discharge cleans the vessel 401 walls. The cleaning step occurs when power from the power supply 450 is not directed so as to cause the two rods to sputter, but the direction of power flow from the power supply 450 is applied such that the vessel 401 walls sputter, so as to emit moieties not conducive to good adherance of the desired coating. During this period, the vessel 401 walls loose ions that are not embedded in the walls. Unwanted particulates embedded on the vessel 401 walls will be sputtered off during this pretreatment or cleaning process. Ejected impurities, such as hydrocarbons are volatilized and carried out of the reaction atmosphere. Also, at least a portion of the substrate material will be sputtered so that any natural oxides will be reduced, providing a means for increasing adhesion of the subsequently deposited film. Inasmuch as both surfaces (the electrode and the vessel wall) are sputtered at the same rate, a net deposition will occur on the larger of the two areas. Inasmuch as the surface area of wall (i.e., the target surface) is relatively large compared to the electrode, anything that is sputtered off on the wall is unlikely to adhere to the electrode. Rather, the impurities are enveloped into the shield gas rather than finding their way back to the chamber wall. The impurity will be swept out with the gas into the vacuum pump or similar means utilized to maintain the pressure gradient through the chamber.

As described above, the pretreatment process removes unwanted moieties, fluids, solids from the vessel 401 walls. For example, water or other polar fluids found on vessel 401 walls is a particular problem as the unintended oxygen components thereof interfere with the quality of the film due to the increased electrical resistance inherent with such moieties. Also, the hydrogen component of water and related polar compounds results in unwanted formulations of hydrides. As such, the pretreatment (in this instance cleaning) step removes the water from the walls.

Further, the pretreatment step optimizes the invented process by enabling consistent and reproducible results. For example, as contaminants such as water are removed from the walls, the chemical makeup of the resulting film remains consistent. Without the pretreatment step, the character and properties of the film may vary, thereby hindering the production of electrically continuous and blemish-free surfaces.

A prototype vacuum chamber was developed embodying the invented device and method. The chamber was fabricated from austenite stainless steel, the inner surface of which is overlayed with a continuous aluminum coating so as to reduce wakefield losses to a level within the resistivity budget of the particular application.

The method disclosed herein allows application of a coating to a fully fabricated chamber 5 mm high, 12.5 mm wide and 2460 mm long. The process utilizes a pair of small electrodes, centered in the aperture (by an externally applied magnetic field, or internally inserted spacers). The electrodes are attached to a high frequency (such as in the range of at least 25-80 kHz) AC power supply. In this configuration, each electrode is connected to the opposite polarity of the other. The chamber cavity is filled with argon gas to facilitate the formation of a glow discharge, causing the aluminum electrodes to sputter onto the chamber walls.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. For example, another embodiment of the invention is where precoated tubes of a desired shape are available, but the tubes are not made of desired material. In these instances, desired films are plated onto the tubes, for example, such that the final coating comprises an outer layer of a relatively reactive material such as titanium, and a relatively less reactive material such as aluminum. The thin titanium layer of between 10 nm and 100 nm serves as the adhesive layer for any moieties sputtered thereon, at the same time being depleted to leave the aluminum underlayment. While substantially all of the titanium adhesive is removed during the sputtering process, any unreacted (i.e. unoxidized) titanium would not hinder final coating adhesion characteristics.

Therefore, it is intended that the invention not be limited to the particular embodiment disclosed, but that the invention will include all embodiments falling within the scope of the appended claims.

The embodiment of the invention in which an exclusive property or privilege is claimed is defined as follows:

1. A system for coating an inside surface of a vessel having an inner diameter less than 15 millimeters, the system consisting of comprising:
   a. an alternating current power supply generating an alternating current;
   b. a cathode having a first longitudinal axis substantially parallel to a longest length of the vessel and having an interior channel formed therein which runs coaxially with the first longitudinal axis of the cathode, wherein the interior channel is adapted to receive a coolant, and an anode having a second longitudinal axis substantially parallel to the longest length of the vessel and having an interior channel formed therein which runs coaxially with the second longitudinal axis of the anode, wherein the first longitudinal axis of the cathode is different from and parallel to the second longitudinal axis of the anode and wherein a gap separates the cathode from the anode and the cathode and the anode are in electrical communication with the alternating current power supply and wherein the alternating current is applied to the cathode and anode, wherein the cathode and anode are adapted to be substantially entirely received and substantially centered within the vessel; and
   c. means for maintaining the inside surface of the vessel in a controlled atmosphere wherein the alternating current is applied to the cathode and anode to sputter material from the cathode and anode to coat the inside surface of the vessel.

2. The system as recited in claim 1 wherein the anode is in fluid communication with the atmosphere.

3. The system as recited in claim 1 wherein the gap between the cathode and the anode is 0.5 millimeters or greater.

4. The system as recited in claim 1 wherein the anode is integrally molded with the inside surface.

5. The system as recited in claim 1 wherein the inside surface comprises an electrically nonconductive material selected from the group consisting of ceramic, glass, and combinations thereof.

6. The system as recited in claim 1 wherein the vessel comprises electrically conductive material selected from the group consisting of metal, metal, alloy, or composite material containing electrically conductive material dispersed there through, and combinations thereof.

7. The system as recited in claim 1 wherein the anode is adapted to be received by the vessel such that the anode is positioned at least 0.5 mm away from the inside surface of the vessel.

8. The system as recited in claim 1 wherein an inner diameter of the anode and cathode is each 0.8 millimeters.

9. The system as recited in claim 1 wherein the anode and the cathode comprise aluminum.

10. The system as recited in claim 1 wherein the means for maintaining the atmosphere includes contacting the inside surface of the vessel with a gas selected from the group consisting of oxygen, nitrogen, argon, helium, neon and combinations thereof.

11. The system as recited in claim 1 wherein a ratio of vessel diameter to cathode diameter is between 4:1 to 23:1.

12. The system as recited in claim 1 wherein a ratio of vessel diameter to anode diameter is between 4:1 to 23:1.

13. The system as recited in claim 1 wherein an outer diameter of the cathode diameter is one third the inner diameter of the vessel.

14. A system for coating an inside surface of a vessel having an inner diameter less than 15 millimeters, the system consisting of:
   a. an alternating current power supply generating an alternating current;
   b. a cathode having a first longitudinal axis substantially parallel to a longest length of the vessel and having an interior channel formed therein which runs coaxially with the first longitudinal axis of the cathode and an anode having a second longitudinal axis substantially parallel to the longest length of the vessel and having an interior channel formed therein which runs coaxially with the second longitudinal axis of the anode, the interior channels are adapted to receive a coolant, wherein the first longitudinal axis of the cathode is different from and parallel to the longitudinal axis of the anode and wherein a gap separates the cathode from the anode and the cathode and the anode are in electrical communication with the alternating current power supply and wherein alternating current is applied to the cathode and anode, wherein the cathode and anode reside substantially within and substantially centered within the vessel; and
   c. means for maintaining the surface of the vessel in a controlled atmosphere wherein alternating current is applied to the cathode and anode to sputter material from the cathode and anode to coat the inside surface of the vessel and wherein the means for maintaining the atmosphere includes contacting the inside surface of the vessel with a gas selected from the group consisting of oxygen, nitrogen, argon, helium, neon and combinations thereof.

15. The system as recited in claim 14 wherein the gap between the cathode and the anode is about 0.5 millimeters.

16. The system as recited in claim 1 wherein a cooling liquid is circulated through the interior channels within the cathode and anode and current is alternately applied between the cathode and anode such that when material is removed from one of the cathode or anode the alternate cathode or anode is being cooled.

17. The system as recited in claim 14 wherein a cooling liquid is circulated through the interior channels within the cathode and anode and current is alternately applied between the cathode and anode such that when material is removed from one of the cathode or anode the alternate cathode or anode is being cooled.

\* \* \* \* \*